(12) United States Patent
Pattnayak et al.

(10) Patent No.: US 8,436,640 B1
(45) Date of Patent: May 7, 2013

(54) AREA OPTIMIZED OUTPUT IMPEDANCE CONTROLLED DRIVER

(75) Inventors: Tapan Pattnayak, Bangalore (IN); Nilima Mahadev Malhotra, Andhra Pradesh (IN); Mark R. Tennyson, Irvine, CA (US)

(73) Assignee: Conexant Systems, Inc., Newport Beach, CA (US)

( * ) Notice: Subject to any disclaimer, the term of this patent is extended or adjusted under 35 U.S.C. 154(b) by 170 days.

(21) Appl. No.: 12/941,703

(22) Filed: Nov. 8, 2010

(51) Int. Cl.
 *H03K 19/003* (2006.01)
 *H03K 19/0175* (2006.01)

(52) U.S. Cl.
 USPC .......................................................... 326/30

(58) Field of Classification Search ............... 326/30
 See application file for complete search history.

(56) References Cited

U.S. PATENT DOCUMENTS

| | | | | |
|---|---|---|---|---|
| 6,084,425 A * | 7/2000 | Liaw et al. | | 326/30 |
| 6,425,097 B1 * | 7/2002 | Elachkar et al. | | 714/43 |
| 6,756,858 B2 * | 6/2004 | Gonzalez et al. | | 333/17.3 |
| 7,930,452 B1 * | 4/2011 | Priest et al. | | 710/58 |
| 2003/0197528 A1 * | 10/2003 | Shibata et al. | | 326/86 |
| 2009/0091349 A1 * | 4/2009 | Bhakta et al. | | 326/30 |

OTHER PUBLICATIONS

JEDEC Standard—Stub Series Terminated Logic for 1.8 V (SSTL_18), JESD8-15A, JEDEC Solid State Technology Association (Sep. 2003).
JEDEC Standard—DDR2 SDRAM Specification, JESD79-2F, JEDEC Solid State Technology Association (Nov. 2009).

\* cited by examiner

*Primary Examiner* — Jany Richardson
(74) *Attorney, Agent, or Firm* — Farjami & Farjami LLP

(57) ABSTRACT

The present invention significantly reduces the chip size of a metal-oxide-semiconductor (MOS) field-effect transistor, which serves as a driver for output impedance drivers, such as, but not limited to, double data rate (DDR2) synchronous dynamic random access memory (SDRAM). In an embodiment of the invention, a voltage drop across the driver is a decreased ratio of the supply voltage, e.g., three-tenths of the supply voltage, lower than half of the supply voltage. A smaller voltage drop allows a lower current and a higher impedance to be used in the driver. By having a higher impedance across the driver, the physical area needed for the DDR2 driver is reduced because a transistor with a smaller physical width can be used. A DDR2 driver operating at the decreased ratio is the functional equivalent of the driver operating with the supply voltage or half of the supply voltage, with the added advantage of the reduced area.

18 Claims, 4 Drawing Sheets

AREA OPTIMIZED OUTPUT IMPEDANCE CONTROLLED DRIVER

BACKGROUND OF THE INVENTION

1. Field of Invention

This invention relates to electronic drivers and more specifically, to an improved impedance control technique for significantly reducing chip size of a metal-oxide-semiconductor (MOS) field-effect transistor, which serves as a driver for double data rate synchronous dynamic random access memory (SDRAM).

2. Description of Related Art

Stub series terminated logic (SSTL) is an electrical interface for driving transmission lines commonly used with double data rate (DDR) dynamic random access memory (DRAM) integrated circuits and memory modules. SSTL comes in three different standards as defined by the JEDEC Solid State Technology Association: SSTL_2, SSTL_3, and SSTL_18. SSTL assumes that transmission line termination is required. As such, SSTL has specifications for output impedance and different methods of termination. Impedance is a measure of opposition to current, extending the direct current (DC) concept of resistance to alternating current (AC) circuits. Termination is important for high-speed signaling because a properly terminated transmission line reduces reflections, reduces electromagnetic interference (EMI) emissions, improves settling time, and improves timing margins.

SSTL_2 and SSTL_3 are used with DDR memory and define two classes of drivers that are targeted at different termination schemes. SSTL_18 is used with DDR2 memory, which is the next generation of DDR. DDR and DDR2 are both types of SDRAM. SDRAM has a synchronous interface, meaning that it waits for a clock signal before responding to control inputs and is therefore synchronized with a computer's system bus. The clock is used to drive an internal finite state machine that pipelines incoming instructions. This allows the chip to have a more complex pattern of operation than an asynchronous DRAM, which does not have a synchronized interface. DDR2 supersedes the original DDR SDRAM specification and the two are not compatible. In addition to double pumping the data bus as in DDR SDRAM (transferring data on the rising and falling edges of the bus clock signal), DDR2 allows higher bus speed and requires lower power by running the internal clock at one quarter the speed of the data bus. The two factors combine to require a total of four (4) data transfers per internal clock cycle. Thus, without speeding up the memory cells themselves, DDR2 can effectively operate at twice the bus speed of DDR.

With data being transferred 64 bits at a time, DDR2 SDRAM gives a transfer rate of (memory clock rate)×2 (for bus clock multiplier)×2 (for dual rate)×64 (number of bits transferred)/8 (number of bits/byte). Thus, with a memory clock frequency of 100 MHz, DDR2 SDRAM gives a maximum transfer rate of 3200 MB/s. Since the DDR2 clock runs at half the DDR clock rate, DDR2 memory operating at the same external data bus clock rate as DDR will provide the same bandwidth, but with higher latency, resulting in inferior performance. Alternatively, DDR2 memory operating at twice the external data bus clock rate as DDR may provide twice the bandwidth with the same latency. The best-rated DDR2 memory modules are at least twice as fast as the best-rated DDR memory modules.

The SSTL_18 standard has been developed particularly with the objective of providing a relatively simple upgrade path from metal oxide semiconductor (MOS) push-pull interface designs. The standard is particularly intended to improve operation in situations where busses must be isolated from relatively large stubs. External resistors provide this isolation and also reduce the on-chip power dissipation of the drivers. Busses may be terminated by resistors to an external termination voltage. To achieve better signal integrity, the output impedance of a DDR2 driver should be controlled, i.e., calibrated to a desired impedance as established by an external resistor.

FIG. 1 illustrates a conventional output impedance control circuit 100 that compares the impedance of (or the voltage across) a driver 135 (e.g., a SSTL_18 output driver PMOS transistor and in series on-chip resistor, an output driver, a calibrated resistance driver, etc.) with the impedance of (or the voltage across) an external precision resistor 150 (e.g., a fixed resistor, a 38 ohm external precision resistor, etc.). The implementation of the conventional output impedance control circuit 100 is readily apparent to one of ordinary skill in the art. SSTL_18 requires a supply voltage to the output buffers of a DDR2 memory chip, $V_{DDQ}$, to be approximately 1.8 volts, and a tracking termination voltage, $V_{TT}$, to be approximately 0.9 volts (i.e., ½ of $V_{DDQ}$). The driver 135 comprises "N" number of fingers 140A-N (e.g., PMOS transistor fingers, a transistor and in series on-chip resistor fingers, etc.) comprising a transistor and an in series on-chip resistor. The conventional output impedance control circuit 100 further includes a comparator 130 and a counter 120. Although the fingers 140 are illustrated as being a PMOS transistor, calibration can just as easily be performed using an NMOS transistor.

In operation, the impedance of the external precision resistor 150 is compared to the impedance of one or more of the fingers 140A-N of the driver 135. Initially, the comparator 130 compares the voltage across a first finger 140A with the voltage across the external precision resistor 150. If the voltage across the external precision resistor 150, which is input into the positive input of the comparator, is less than $V_{TT}$ (i.e., half of the supply voltage, typically 0.9 volts), which is the voltage into the negative input of the comparator, the output voltage of the comparator 130 is high, and the output is then fed into the counter 120. The high input of the counter 120 increments the value stored in the counter 120 by one, which enables one more finger 140B of the driver 135. The counter 120 registers the number of PMOS transistor fingers enabled in the driver 135. Enabling the finger 140B decreases the impedance of the driver 135 because the enabled fingers 140A-B are impedances connected in parallel, which reduces the equivalent impedance. The decreased impedance across the driver 135 results in a decreased voltage across it. Because the driver 135 and the external precision resistor 150 form a voltage divider, the decreased voltage across the driver 135 increases the voltage across the external precision resistor 150 towards $V_{TT}$.

In one example, the supply voltage is 1.8 V, the counter 120 has four bits that enable 16 of the fingers 140, with a minimum of five of the fingers 140 enabled, where each finger 140 is set at 500 ohms, and the external precision resistor 150 is set at 38 ohms. In this example, when the counter 120 enables five of the fingers 140, the equivalent resistance is 100 ohms and the voltage across the external precision resistor 150 is 0.5 V. When ten of the fingers 140 are enabled, the equivalent resistance drops to 50 ohms and the voltage across the external precision resistor 150 increases to 0.78 V. In this example, the voltage across the external precision resistor 150 reaches half of the supply voltage when 14 of the fingers 140 are enabled, where the equivalent resistance is 36 ohms. As shown in this example, as more fingers 140 are enabled, the equivalent resistance of the fingers 140 decreases and the voltage across the external precision resistor 150 increases towards half of the supply voltage. The rate of decrease of the equivalent resistance of the fingers 140 is progressively less as more fingers are enabled (e.g., 150 ohms for five fingers, 50 ohms for 10 fingers, and 33 ohms for 15 fingers).

The resistance of each of the fingers 140 (e.g., 500 ohms in the example above) has a minimum, maximum, and typical value to allow the voltage across the external precision resistor 150 to reach half of the supply voltage. In this example, the minimum resistance is 190 ohms and the maximum resistance is 760 ohms. The typical resistance is selected far enough away from the minimum and maximum resistance values (e.g., 380 ohms), because the transistors of the driver 135 vary with process (e.g., channel length, threshold voltages, etc.), voltage (e.g., 1.7 V to 1.9 V), and temperature (e.g., −40° C. to +125° C.). If each of the fingers 140 is set to 190 ohms, 380 ohms, or 760 ohms, respectively, the voltage across the external precision resistor 150 reaches half of the supply voltage when five, ten, or 20 fingers, respectively, are enabled.

The comparator 130 compares the voltage $V_{TT}$ (i.e., ½ of $V_{DDQ}$) in the positive input of the compactor 130, with the voltage across the external precision resistor 150 at the negative input of the comparator 130. The fingers 140A-N are interactively enabled, lowering the impedance of the driver 135 towards the impedance of the external precision resistor 150. Each time the impedance of the driver 135 is greater than the impedance of the external precision resistor 150, one more finger of the driver 135 is enabled, thereby decreasing the impedance of the driver 135. This iterative calibration process continues until the difference between the input terminals of the comparator 130 is approximately zero. At this point, the voltage drop across the external precision resistor 150 equals the voltage drop across the driver 135, both voltage drops being $V_{TT}$. The current flows directly through the driver 135 and the external precision resistor 150. Accordingly, the impedance of the driver 135 matches that of the external precision resistor 150. The counter 120 stops when matching impedances of the driver 135 and external precision resistor 150 are found, such that the optimum number of enabled fingers 140A-N of the driver 135 is registered in the counter 120.

In one embodiment, the impedance of the driver 135 is approximately 38 ohms, 18 ohms from the transistor and 20 ohms from the in series on chip resistor, matching 38 ohms of the external precision resistor 150. The voltage across the driver 135 and the external precision resistor 150 are both $V_{TT}$. In another embodiment, the impedance of the PMOS transistor is another value less than 21 ohms.

SUMMARY OF THE INVENTION

The present invention overcomes these and other disadvantages of the prior art by employing a ratio of the voltage drop less than half of the supply voltage across an output impedance driver, which in turn significantly reduces the chip size of a metal-oxide-semiconductor (MOS) field-effect transistor, which serves as a driver for output impedance drivers, such as, but not limited to, double data rate (DDR2) synchronous dynamic random access memory (SDRAM). In an embodiment of the invention, a voltage drop across the driver is a decreased ratio of the supply voltage, e.g., three-tenths of the supply voltage, lower than half of the supply voltage. A smaller voltage drop allows a lower current and a higher impedance to be used in the driver. By having a higher impedance across the driver, the physical area needed for the DDR2 driver is reduced because a transistor with a smaller physical width can be used.

In an embodiment of the invention, a device comprises: a reference voltage set to be a supply voltage or half of the supply voltage; one or more external resistors connected in series with the reference voltage, the one or more external resistors having one or more impedance values; and a driver connected in series with the external resistors, the driver having an equivalent impedance value and a voltage drop across the driver, wherein a first value for the one or more impedance values and a second value for the equivalent impedance value are calculated with the voltage drop being a voltage drop of half of the supply voltage, wherein the one or more impedance values are set larger than the first value and the equivalent impedance value is set larger than the second value with the voltage drop being less than half of the supply voltage. The device may further comprise a minimum current corresponding to the voltage drop of half of the supply voltage, wherein a current through the driver is less than the minimum current. The one or more impedance values are set four times larger than the first value and the equivalent impedance value is set four times larger than the second value. The driver may comprise two impedances such as an in series on-chip impedance and a transistor impedance. The transistor impedance is calibrated iteratively based on the in series on-chip impedance and the one or more external resistors. The reference voltage is the supply voltage, the one or more external resistors comprise two resistors. The two resistors connect at a termination node, wherein the termination node is tied to a comparator for calibrating the equivalent impedance value. The voltage drop may be determined by a JEDEC SSTL_18 standard.

In another embodiment of the invention, a method comprises: setting a reference voltage to be a supply voltage or half of the supply voltage; using one or more external resistors connected in series with the reference voltage, the one or more external resistors having one or more impedance values; using a driver connected in series with the external resistors, the driver having an equivalent impedance value and a voltage drop across the driver; calculating a first value for the one or more impedance values and a second value for the equivalent impedance value with the voltage drop being a voltage drop of half of the supply voltage; and setting the one or more impedance values larger than the first value and the equivalent impedance value larger than the second value with the voltage drop being less than half of the supply voltage. The method may further comprise a minimum current corresponding to the voltage drop of half of the supply voltage, wherein a current through the driver is less than the minimum current. The impedance values are set four times larger than the first value and the equivalent impedance value is set four times larger than the second value. The driver may comprise two impedances such as an in series on-chip impedance and a transistor impedance. The transistor impedance is calibrated iteratively based on the in series on-chip impedance and the one or more external resistors. The reference voltage is the supply voltage, the one or more external resistors comprise two resistors. The two resistors connect at a termination node, wherein the termination node is tied to a comparator for calibrating the equivalent impedance value. The voltage drop may be determined by a JEDEC SSTL_18 standard.

The present invention provides several advantages. First, the output driver impedance is calibrated under a voltage condition that is closer to the actual voltage across the driver at the time of functional switching. Second, a more optimal PMOS (or NMOS) transistor size can be selected. When the voltage drop across the PMOS (or NMOS) transistor is overestimated, a transistor with more fingers needs to be selected, at the cost of a larger size, in order to provide a range of impedances for the transistor which cover the impedance at the calibration point. When the impedance at the functional switching voltage is implemented, the size of the transistor can be made smaller to achieve the same desired output impedance during switching. In the present invention, the impedance is actually optimized at the operational point, enabling the SSTL__18 DDR2 specification to be met with a smaller PMOS (or NMOS) transistor. In principle it has been found that due to this type of calibration, the output driver can actually reduce the size of the driver. Post layout area savings for the driver have been recorded at least between 20% to 30%, although larger and small area savings are possible as well.

The foregoing, and other features and advantages of the invention, will be apparent from the following, more particular description of the preferred embodiments of the invention, the accompanying drawings, and the claims.

BRIEF DESCRIPTION OF THE DRAWINGS

For a more complete understanding of the background of the present invention, reference is now made to the ensuing descriptions taken in connection with the accompanying drawings briefly described as follows.

DETAILED DESCRIPTION OF EMBODIMENTS

Figure 1:
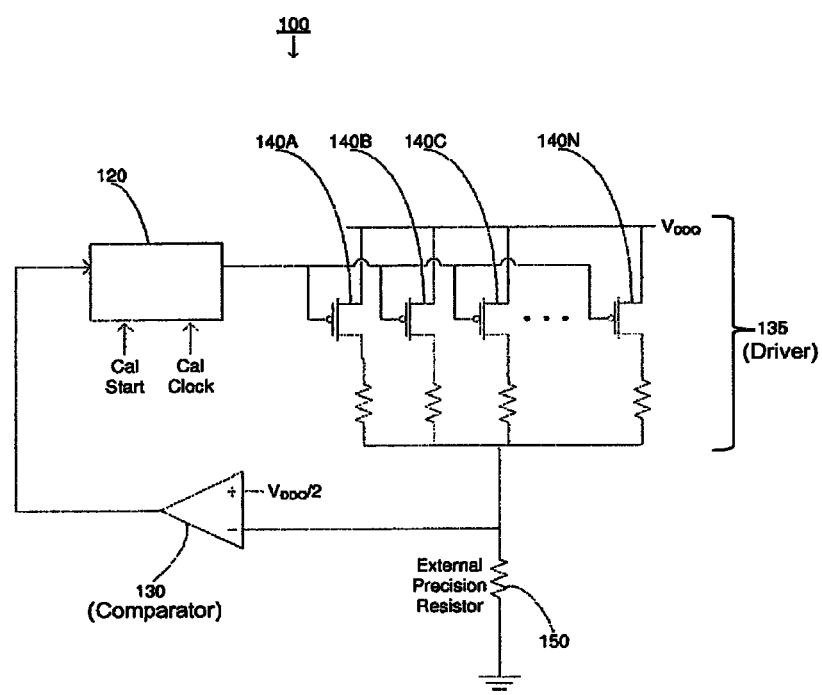
FIG. 1 illustrates a conventional output impedance control circuit that compares a driver with an external precision resistor.

Further features and advantages of the invention, as well as the structure and operation of various embodiments of the invention, are described in detail below with reference to the accompanying FIGS. 2-4, wherein like reference numerals refer to like elements. Although the invention is described in the context of a DDR2 driver application, one of ordinary skill in the art readily appreciates that the present invention can be implemented in other high-speed devices such as, but not limited to peripheral component interconnect express (PCI express or PCIe) expansion cards and DDR3 memory modules.

In general, the present invention provides an output impedance control circuit for an SSTL__18 electrical interface employing a lower reference voltage across the driver. However, if a lower reference voltage is used (e.g., 0.3 $V_{DDQ}$), i.e., a voltage lower than half of $V_{DDQ}$, the impedance of the transistor cannot be compared directly to the desired impedance of an external resistor. When the voltage across the external precision resistor reaches half of the supply voltage due to the iteratively smaller voltage drop across the driver, the voltage across the driver is still proportional to the supply voltage, but at a lower ratio.

In an exemplary embodiment of the invention, the impedance calibration of a DDR2 driver may be performed with external resistors of approximately 250 ohms and 100 ohms with the driver impedance of approximately 150 ohms (approximately 70 ohms plus 80 ohms). The impedance of the driver is proportional to the supply voltage (e.g., 1.8 volts), such that a voltage drop (e.g., 0.9 volts), compared to the actual voltage drop (e.g., 0.6 volts), leads to an overestimated minimum current (e.g., 13.4 mA). By lowering (e.g., relaxing) the minimum current below the overestimated minimum current (e.g., less than 13.4 mA), the impedance of the DDR2 driver can be calibrated with less fingers, allowing a smaller transistor to be selected.

Figure 2:
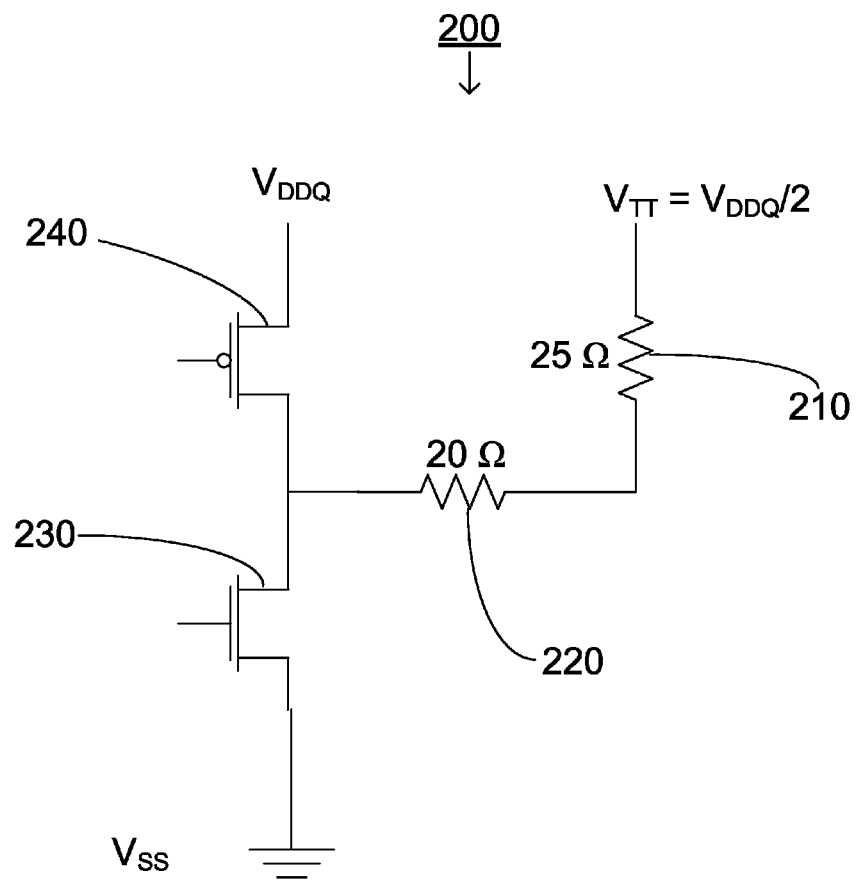
FIG. 2 illustrates a conventional DDR2 driver circuit.

FIG. 2 illustrates a conventional DDR2 driver circuit 200 (e.g., an output buffer, a typical DDR2 driver circuit, etc.) under the SSTL__18 standard. See JEDEC Solid State Technology Association, "Stub Series Terminated Logic for 1.8 V (SSTL__18)," JEDEC, p. 7 (2003), the disclosure of which is incorporated by reference herein in its entirety. The DDR2 driver circuit 200 comprises an external termination resistor 210 (e.g., an equivalent termination resistance, a termination resistor, etc.) with a resistance of 25 ohms, an in series on-chip resistor 220 (e.g., a stub series resistor, an off-chip resistor, etc.) with a resistance of 20 ohms. A NMOS transistor 230 and a PMOS transistor 240 are both shown, as either one of which can be calibrated, although not both at the same time. FIG. 2 illustrates only one of the multiple DDR2 fingers for simplicity. Additionally, a counter, such as counter 120, coupled to the gates of the NMOS transistor 230 and the PMOS transistor 240, is also not shown for simplicity. In one embodiment, the external termination resistor 210 and the in series on-chip resistor 220 are set such that the transistor impedance is calibrated to 18±3 ohms.

The specifications of the SSTL__18 standard set the external termination resistor 210 to be 25 ohms to achieve the minimum current. The external termination resistor 210 terminates to $V_{TT}$, which is half the supply voltage, $V_{DDQ}$. The SSTL__18 standard sets $V_{DDQ}$ at 1.8 volts and thus, $V_{TT}$ is 0.9 volts. $V_{SS}$ is connected to ground. A further simplified and equivalent DDR2 driver application substitutes either one of the PMOS transistor 240 or the NMOS transistor 230, although not both at the same time, with a single impedance, for calibration calculation purposes, with a transistor impedance 330 representing the NMOS transistor 230 as illustrated in FIG. 3.

Figure 3:
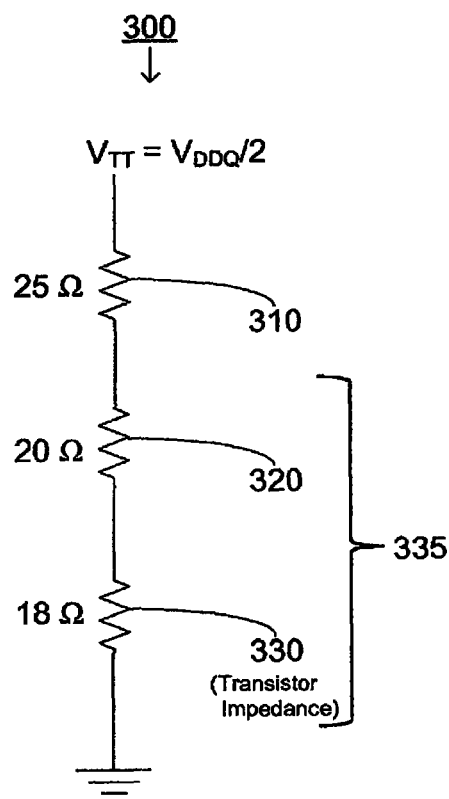
FIG. 3 illustrates a simplified equivalent circuit of the conventional DDR2 driver circuit illustrated in FIG. 2.

FIG. 3 illustrates a DDR2 driver circuit 300 (e.g., an equivalent impedance circuit, an equivalent DDR2 driver circuit, a DDR2 driver application, an output buffer, etc.) simplified with the equivalent impedance of the DDR2 driver circuit 200 depicted in FIG. 2. The purpose of the DDR2 driver circuit 300 is to present a simplified, equivalent circuit of the DDR2 driver circuit 200 with the transistor impedance 330 of FIG. 3 representing the NMOS transistor 230 of FIG. 2, which makes it easier to observe the voltage divider apparent between an external termination resistor 310 and an equivalent impedance value of driver 335 (e.g., a memory driver).

The DDR2 driver circuit 300 comprises the external termination resistor 310 (e.g., an equivalent termination resistance, a termination resistor, etc.) with a resistance of 25 ohms, an in series on-chip resistor 320 (e.g., a stub series resistor, an off-chip resistor, etc.) with a resistance of 20 ohms and a transistor impedance 330 with an impedance of 18 ohms, collectively the equivalent impedance value of driver 335 is 38 ohms. The in series on-chip resistor 320 and transistor impedance 330 represent one or more fingers of the DDR2 circuit 300. The counter and comparator have large impedances, which do not affect the DDR2 driver circuit 300 and as such are not shown.

According to SSTL__18 standard specifications, the external termination resistor 310 is set to 25 ohms and is terminated to $V_{TT}$, which is half the supply voltage $V_{DDQ}$. SSTL__18 standards set $V_{DDQ}$ at 1.8 volts, and thus, $V_{TT}$ is 0.9 volts. The in series on-chip resistor 320 has an impedance of 20 ohms. The SSTL_18 standard requires a minimum 13.4 mA of current flowing through the external termination resistor 310 and the equivalent impedance value of driver 335 of the DDR2 driver circuit 300.

The equivalent impedance value of the driver 335 is the sum of the impedances of the in series on-chip resistor 320 and the transistor impedance 330, which is (20+18) ohms, or 38 ohms. The voltage divider between the equivalent impedance value of driver 335 and the external termination resistor 310 yields ½ $V_{DDQ} \times (38)/(38+25)$, which is approximately 0.3 $V_{DDQ}$ across the driver. Therefore, a correct impedance calibration scheme for the output driver would yield 0.3 $V_{DDQ}$ (rather than 0.5 $V_{DDQ}$) across the equivalent impedance value of driver 335.

Figure 4:
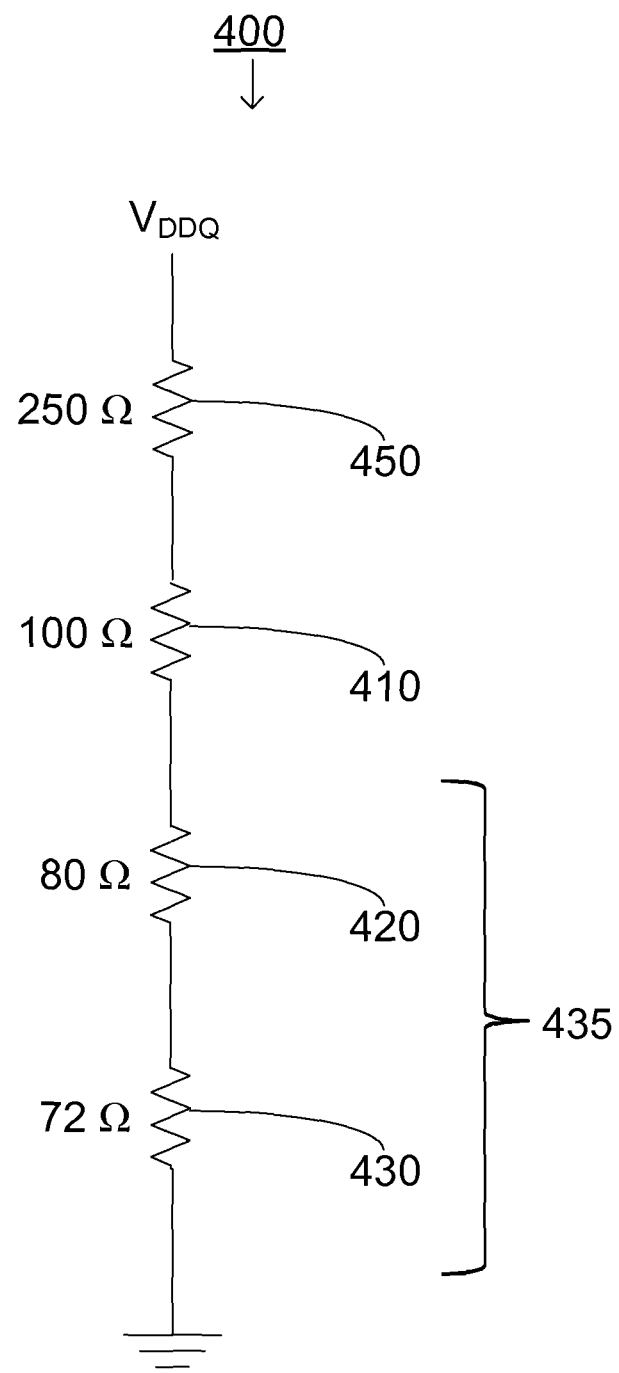
FIG. 4 illustrates a DDR2 driver circuit according to an exemplary embodiment of the invention.

FIG. 4 illustrates a DDR2 driver circuit 400 for an output impedance driver according to an exemplary embodiment of the invention. The DDR2 driver circuit 400 comprises an external precision resistor 450 with a resistance of 250 ohms connected to a termination node, an external termination resistor 410 (e.g., an equivalent termination resistance, a termination resistor, etc.) with a resistance of 100 ohms connected to the termination node, and an equivalent impedance value of driver 435 (e.g., a memory driver with a minimum, maximum, and typical resistance value) calibrated to 152 ohms, rounded to 150 ohms, comprising an in series on-chip resistor 420 (e.g., a stub series resistor, an off-chip resistor, etc.) with a resistance of 80 ohms and a transistor impedance 430 with an impedance of 72 ohms. The in series on-chip resistor 420 and transistor impedance 430 represent the driver of the DDR2 circuit 400. Although the transistor impedance 430 is illustrated as representing an NMOS transistor, it can instead represent a PMOS transistor. The counter and comparator have large impedances which do not affect the DDR2 driver circuit 400 and as such are not shown.

Based on the configuration shown in FIG. 4, the physical width (i.e. the cross-section) of components for calibrating the DDR2 driver circuit 400 can be selected with a smaller size than the DDR2 driver circuit 200 and the DDR2 driver circuit 300. For a transistor, resistance is inversely proportional with the physical width (i.e., a large resistance requires a less transistor fingers and as such a small transistor can be selected).

The external precision resistor 450, the external termination resistor 410, and the equivalent impedance value of driver 435 can be multiplied by a common factor to increase resistance, and this increased resistance lowers the current used during calibration without affecting the voltage driving the driver 435. Selecting the equivalent impedance value of driver 435 to be a factor of four larger reduces the current flow during calibration and allows a smaller driver to be selected. In one embodiment, the impedance is multiplied by a factor of four. In another embodiment, the impedance is multiplied by a factor other than four, including any real number greater than one (e.g., 1.7, pi, 5, 8.6, etc.). Post layout area savings for the driver 435 have been recorded at least between 20% to 30%, although larger and small area savings are possible as well. Accordingly, the 25 ohm external termination resistor 310 is increased to become the 100 ohm external termination resistor 410. Additionally, the equivalent impedance value of driver 335 (comprising the 20 ohm in series on-chip resistor 320 and the 18 ohm transistor impedance 330) is increased from 38 ohms to 152 ohms (or 150 ohms for simplification), embodied in FIG. 4 as the equivalent impedance value of driver 435 (comprising the 80 ohm in series on-chip resistor 420 and the 72 ohm transistor impedance 430). The DDR2 driver circuit 400 also embodies the external precision resistor 450 with a resistance of 250 ohms.

A voltage $V_{DDQ}$ is applied to the external precision resistor 450, and a voltage divider is formed with the external precision resistor 450 (250 ohms) and the external termination resistor 410 (100 ohms) on one hand, and the equivalent impedance value of driver 435 (150 ohms for simplification) on the other. This voltage divider yields a voltage of $V_{DDQ} \times (150)/(250+100+150)$ or 0.3 $V_{DDQ}$ across the equivalent impedance value of driver 435. The voltage 0.3 $V_{DDQ}$ is the desired voltage across the equivalent impedance value of driver 435. The desired voltage 0.3 $V_{DDQ}$ is demonstrated in FIG. 3 across the equivalent impedance value of driver 335 (comprising the in series on-chip resistor 320 and the transistor impedance 330). Therefore, the desired voltage 0.3 $V_{DDQ}$ is achieved while the components calibrating the DDR2 driver circuit 400 are reduced in size.

This invention has been described herein using specific embodiments for the purposes of illustration only. It will be readily apparent to one of ordinary skill in the art, however, that the principles of the invention can be embodied in other ways. Therefore, the invention should not be regarded as being limited in scope to the specific embodiments disclosed herein, but instead as being fully commensurate in scope with the following claims.

We claim:

1. A device comprising:
   a reference voltage set to be a supply voltage or half of the supply voltage;
   one or more external resistors connected in series with the reference voltage, the one or more external resistors having one or more impedance values; and
   a driver connected in series with the external resistors, the driver having an equivalent impedance value and a voltage drop across the driver,
   wherein a first value for the one or more impedance values and a second value for the equivalent impedance value are calculated with the voltage drop being a voltage drop of half of the supply voltage,
   wherein the one or more impedance values are set larger than the first value and the equivalent impedance value is set larger than the second value with the voltage drop being less than half of the supply voltage.

2. The device of claim 1, further comprising a minimum current corresponding to the voltage drop of half of the supply voltage, wherein a current through the driver is less than the minimum current.

3. The device of claim 1, wherein the one or more impedance values are set four times larger than the first value and the equivalent impedance value is set four times larger than the second value.

4. The device of claim 1, wherein the driver comprises two impedances.

5. The device of claim 4, wherein the two impedances comprise an in series on-chip impedance and a transistor impedance.

6. The device of claim 5, wherein the transistor impedance is calibrated iteratively based on the in series on-chip impedance and the one or more external resistors.

7. The device of claim 1, wherein the one or more external resistors comprises two resistors when the reference voltage is the supply voltage.

8. The device of claim 7, wherein the two resistors connect to a comparator for calibrating the equivalent impedance value.

9. The device of claim 1, wherein the voltage drop is determined by a JEDEC SSTL_18 standard.

10. A method comprising:
  setting a reference voltage to be a supply voltage or half of the supply voltage;
  using one or more external resistors connected in series with the reference voltage, the one or more external resistors having one or more impedance values;
  using a driver connected in series with the external resistors, the driver having an equivalent impedance value and a voltage drop across the driver;
  calculating a first value for the one or more impedance values and a second value for the equivalent impedance value with the voltage drop being a voltage drop of half of the supply voltage; and
  setting the one or more impedance values larger than the first value and the equivalent impedance value larger than the second value with the voltage drop being less than half of the supply voltage.

11. The method of claim 10, further comprising a minimum current corresponding to the voltage drop of half of the supply voltage, wherein a current through the driver is less than the minimum current.

12. The method of claim 10, wherein the one or more impedance values are set four times larger than the first standard value and the equivalent impedance value is set four times larger than the second standard value.

13. The method of claim 10, wherein the driver comprises two impedances.

14. The method of claim 13, wherein the two impedances comprise an in series on-chip impedance and a transistor impedance.

15. The method of claim 14, wherein the transistor impedance is calibrated iteratively based on the in series on-chip impedance and the one or more external resistors.

16. The method of claim 10, wherein the one or more external resistors comprises two resistors when the reference voltage is the supply voltage.

17. The method of claim 16, wherein the two resistors connect to a comparator for calibrating the equivalent impedance value.

18. The method of claim 10, wherein the voltage drop is determined by a JEDEC SSTL__18 standard.

* * * * *